(12) United States Patent
Dong et al.

(10) Patent No.: US 12,249,697 B2
(45) Date of Patent: Mar. 11, 2025

(54) TEMPERATURE MEASUREMENT MODULE AND POWER STORAGE MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Xueqing Dong, Mie (JP); Hiroomi Hiramitsu, Mie (JP); Yuto Sato, Mie (JP); Masato Tsutsuki, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 655 days.

(21) Appl. No.: 17/632,068

(22) PCT Filed: Jul. 15, 2020

(86) PCT No.: PCT/JP2020/027441
§ 371 (c)(1),
(2) Date: Feb. 1, 2022

(87) PCT Pub. No.: WO2021/024718
PCT Pub. Date: Feb. 11, 2021

(65) Prior Publication Data
US 2022/0255154 A1     Aug. 11, 2022

(30) Foreign Application Priority Data
Aug. 2, 2019   (JP) .................................. 2019-142753

(51) Int. Cl.
*H05K 1/11* (2006.01)
*H01M 10/42* (2006.01)
(Continued)

(52) U.S. Cl.
CPC ....... *H01M 10/482* (2013.01); *H01M 10/425* (2013.01); *H01M 10/653* (2015.04);
(Continued)

(58) Field of Classification Search
CPC ............ H01M 10/482; H01M 10/653; H01M 10/655; H01M 50/502; H01M 50/204; H01M 10/425; H05K 1/11; H05K 1/189
(Continued)

(56) References Cited

U.S. PATENT DOCUMENTS

2014/0150571 A1* 6/2014 Kuniyoshi ................ G01L 1/20
                                                              156/280
2018/0034115 A1  2/2018 Li et al.
2021/0381909 A1* 12/2021 Lorenz ..................... G01K 1/18

FOREIGN PATENT DOCUMENTS

JP       04-122341       11/1992
JP       2013-251294     12/2013
(Continued)

OTHER PUBLICATIONS

International Search Report issued in International Bureau of WIPO Patent Application No. PCT/JP2020/027441, dated Oct. 6, 2020, along with an English translation thereof.

*Primary Examiner* — Binh B Tran
(74) *Attorney, Agent, or Firm* — Greenblum & Bernstein, P.L.C.

(57) ABSTRACT

A temperature measurement module is for measuring the temperature of a temperature measurement target and includes a flexible printed circuit board that includes an insulating sheet member and circuit patterns routed in the
(Continued)

sheet member, a temperature sensor attached to the flexible printed circuit board, and a heat transfer member thermally fixed to the temperature sensor. The sheet member is provided with through holes located outward of a region overlapped with the temperature sensor, and the heat transfer member includes heat receiving portions that are arranged inside the through holes and receive heat from the temperature measurement target.

6 Claims, 7 Drawing Sheets

(51) Int. Cl.
*H01M 10/48* (2006.01)
*H01M 10/653* (2014.01)
*H01M 10/655* (2014.01)
*H01M 50/204* (2021.01)
*H01M 50/502* (2021.01)
*H05K 1/18* (2006.01)

(52) U.S. Cl.
CPC ....... *H01M 10/655* (2015.04); *H01M 50/204* (2021.01); *H01M 50/502* (2021.01); *H05K 1/11* (2013.01); *H05K 1/189* (2013.01)

(58) Field of Classification Search
USPC .......................................................... 361/784
See application file for complete search history.

(56) References Cited

FOREIGN PATENT DOCUMENTS

| | | |
|---|---|---|
| JP | 2018-059902 | 4/2018 |
| JP | 2018-124125 | 8/2018 |

* cited by examiner

TEMPERATURE MEASUREMENT MODULE AND POWER STORAGE MODULE

TECHNICAL FIELD

The present specification discloses a technique relating to a temperature measurement module and a power storage module.

BACKGROUND ART

Techniques for measuring the temperature of a flexible printed circuit board with use of a temperature sensor are conventionally known. A temperature sensor in JP 2018-124125A is provided with a wiring pattern and a thermistor element on the upper surface of an insulating film to which a crimp terminal is affixed. This thermistor element is covered with a first sealing resin layer, and a second sealing resin layer made of a material having a lower thermal conductivity than the first sealing resin layer is laminated on the first sealing resin layer. The crimp terminal has a wall portion that is U-shaped in a plan view, and the region inward of the wall portion is filled by the first sealing resin layer and the second sealing resin layer.

CITATION LIST

Patent Documents

Patent Document 1: JP 2018-124125A

SUMMARY OF INVENTION

Technical Problem

Because the insulating film is arranged between the crimp terminal and the thermistor element in the above configuration, heat transferred from the measurement target object to the crimp terminal is blocked by the insulating film, and thus the transfer of heat to the thermistor element decreases, and there is a concern that the accuracy of temperature measurement decreases.

Solution to Problem

A temperature measurement module described in the present specification is a temperature measurement module for measuring the temperature of a temperature measurement target, the temperature measurement module including: a flexible printed circuit board that includes an insulating sheet member and a circuit pattern routed in the sheet member; a temperature sensor attached to the flexible printed circuit board; and a heat transfer member thermally fixed to the temperature sensor, wherein the sheet member includes a through hole located outward of a region overlapped with the temperature sensor, and the heat transfer member includes a heat receiving portion that is arranged in the through hole and is configured to receive heat from the temperature measurement target.

Advantageous Effects of Invention

According to the technique described in the present specification, it is possible to suppress a decrease in the accuracy of temperature measurement.

DESCRIPTION OF EMBODIMENTS

Description of Embodiments of Present Disclosure

First, Embodiments of the Present Disclosure Will be Listed and Described (1) A temperature measurement module according to the present specification is a temperature measurement module for measuring the temperature of a temperature measurement target, the temperature measurement module including: a flexible printed circuit board that includes an insulating sheet member and a circuit pattern routed in the sheet member; a temperature sensor attached to the flexible printed circuit board; and a heat transfer member thermally fixed to the temperature sensor, wherein the sheet member includes a through hole located outward of a region overlapped with the temperature sensor, and the heat transfer member includes a heat receiving portion that is arranged in the through hole and is configured to receive heat from the temperature measurement target.

According to this configuration, heat from the temperature measurement target is transferred to the heat receiving portion of the heat transfer member in the through hole of the flexible printed circuit board, and the heat is transferred to the temperature sensor via the heat transfer member. Accordingly, heat is easily transferred from the temperature measurement target to the temperature sensor, thus making it possible to suppress a decrease in the accuracy of temperature measurement performed by the temperature sensor.

(2) A plurality of the through holes are provided respectively on opposite sides of the temperature sensor in the sheet member.

According to this configuration, heat from the temperature measurement target can be transferred to the temperature sensor via the through holes on both sides of the temperature sensor, and therefore heat is even more easily transferred from the temperature measurement target to the temperature sensor, and it is possible to further improve the accuracy of temperature measurement.

(3) The heat transfer member fills the through hole.

According to this configuration, it is possible to improve the ability for heat to be transferred by the heat transfer member in the through hole.

(4) The temperature sensor includes a plurality of terminals, the flexible printed circuit board includes a plurality of the circuit patterns that are connected to the terminals, and the plurality of circuit patterns include a first circuit pattern and a second circuit pattern that extends in a direction opposite to the first circuit pattern relative to the temperature sensor.

According to this configuration, the circuit patterns can be routed efficiently, and thus the wiring density of the flexible printed circuit board can be increased.

(5) The temperature sensor includes a plurality of terminals, and the circuit pattern extends along a direction orthogonal to a direction in which the plurality of terminals are arranged side by side.

According to this configuration, the circuit patterns can be routed efficiently, and thus the wiring density of the flexible printed circuit board can be increased.

(6) The temperature measurement module further includes: a reinforcing plate arranged on a temperature measurement target side of the flexible printed circuit board, wherein the reinforcing plate includes a reinforcing plate through hole that is in communication with the through hole, and the heat receiving portion is arranged inside the reinforcing plate through hole.

According to this configuration, bending of the flexible printed circuit board can be suppressed by the reinforcing plate. Also, heat from the temperature measurement target can be transferred to the temperature sensor via the heat transfer member in the reinforcing plate through hole.

(7) A power storage module includes: a plurality of power storage elements that each include a positive electrode terminal and a negative electrode terminal; bus bars that serve as a temperature measurement target and each connect adjacent electrode terminals of the power storage elements; and the temperature measurement module described above.

According to this configuration, it is possible to measure the temperature of the bus bars that connect the electrode terminals of the power storage elements.

Details of Embodiments of Present Disclosure

Specific examples of the present disclosure will be described below with reference to the drawings. Note that the present disclosure is not limited to these examples, but rather is indicated by the scope of claims, and is intended to include all modifications within the meaning and scope equivalent to the claims.

First Embodiment

A first embodiment will be described below with reference to FIGS. 1 to 3.

A temperature measurement module 20 of the present embodiment is for provision in a power storage module 10 installed in a vehicle such as an automobile, and measures the temperature of a bus bar 15 serving as the temperature measurement target. In the following description, the X direction and the Y direction in FIG. 1 are respectively the forward direction and the leftward direction, and the Z direction in FIG. 2 is the upward direction.

Power Storage Module 10

Figure 1:
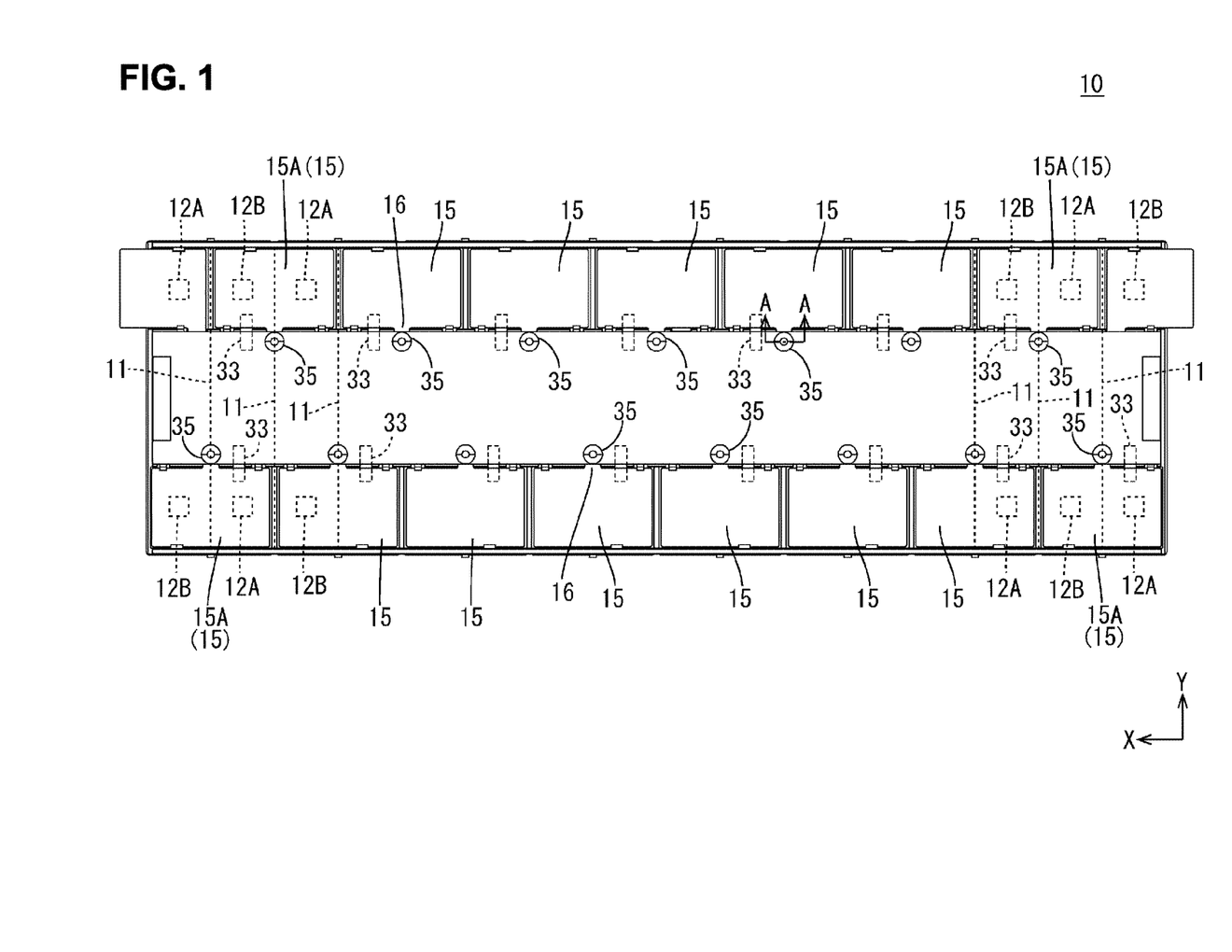
FIG. 1 is a plan view showing a power storage module according to a first embodiment.

As shown in FIG. 1, the power storage module 10 includes a plurality of power storage elements 11, a plurality of bus bars 15 that connect adjacent electrode terminals 12A and 12B of the power storage elements 11, and a temperature measurement module 20 for measuring the temperature of each of the bus bars 15. The power storage elements 11 are arranged in a row to form a power storage element group. Each power storage element 11 has positive and negative electrode terminals 12A and 12B (in FIG. 1, the positive electrode is shown as 12A, and the negative electrode is shown as 12B) on the upper surface of a flat rectangular parallelepiped main body in which a charge storage element (not shown) is housed. The power storage elements 11 are arranged such that adjacent electrode terminals 12A and 12B have opposite polarities. The electrode terminals 12A and 12B at the ends of the series-connected power storage element group are connected to an external ECU (Electronic Control Unit) or the like via electric wires or the like. The ECU is provided with a microcomputer, elements, and the like, and has a well-known configuration including functions for detecting the voltage, current, temperature, and like of the power storage elements 11, as well as controlling the charging and discharging of the power storage elements 11, for example.

Bus Bar 15

Each bus bar 15 is made of a metal plate material such as copper, a copper alloy, aluminum, or an aluminum alloy, and includes a rectangular bus bar body 15A that connects adjacent electrode terminals 12A and 12B, and a measurement target portion 16 that protrudes from a side edge portion of the bus bar body 15A. The bus bar body 15A can be connected to the electrode terminals 12A and 12B by a known connection means such as welding or bolt fastening. A voltage detection terminal 33 for detecting the voltage of the bus bar 15 (and the power storage element 11) is connected to the bus bar body 15A by a known connection means such as welding or crimping. As shown in FIGS. 2 and 3, the measurement target portion 16 is a protrusion that protrudes from a long side (one side) of the bus bar body 15A along the same plane as the bus bar body 15A, and the temperature of the measurement target portion 16 is detected by a temperature sensor 30 that is described later.

Temperature Measurement Module 20

Figure 2:
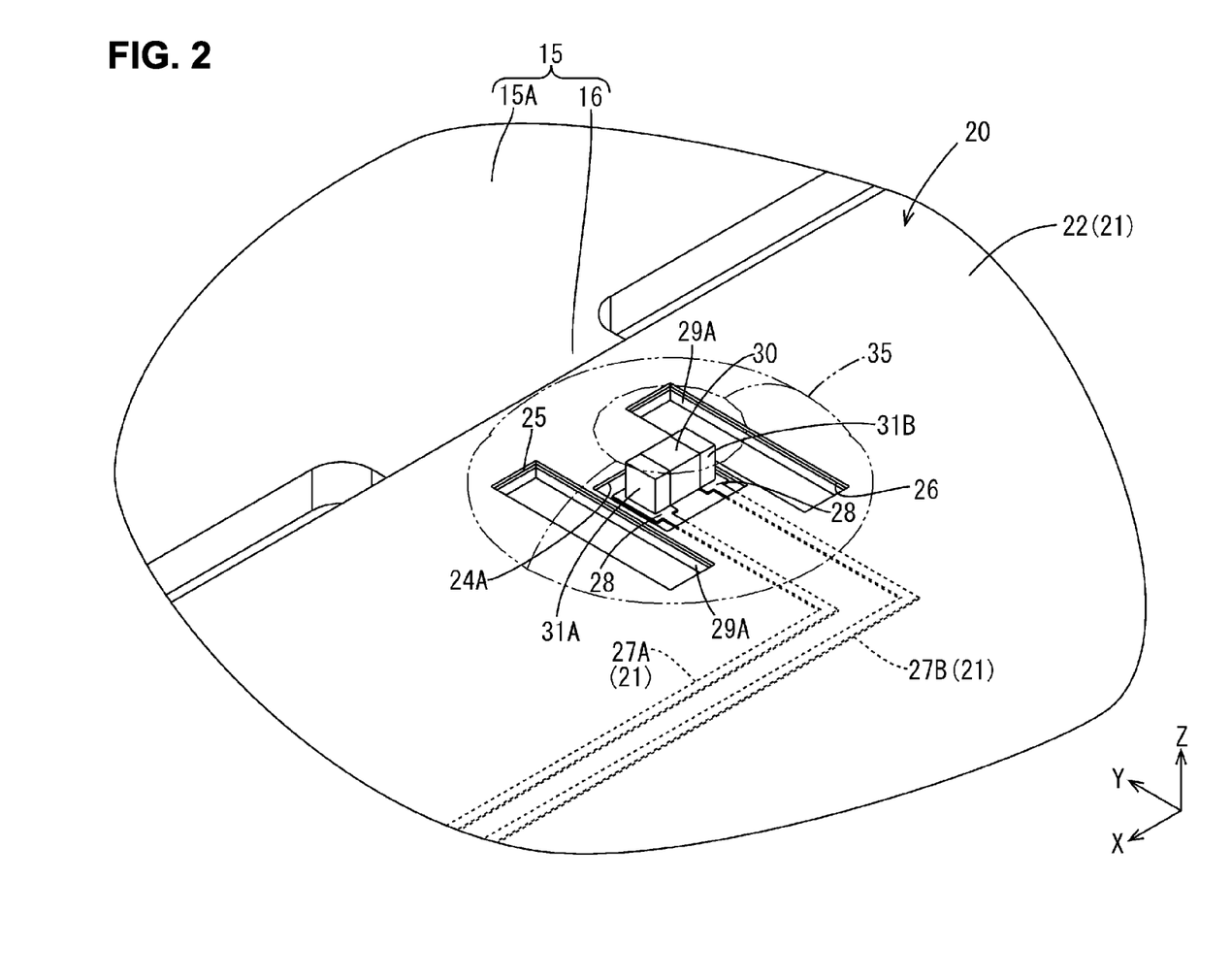
FIG. 2 is an enlarged perspective view of a region including a temperature sensor and a heat transfer member in the power storage module.

As shown in FIG. 2, the temperature measurement module 20 includes a flexible printed circuit board 21 (hereinafter referred to as the FPC 21), a temperature sensor 30, and a heat transfer member 35 (only a portion of the temperature measurement module 20 is shown in FIG. 2, and the other portions are not shown). The FPC 21 is shaped as a band that extends in the front-rear direction, and includes a sheet member 22 that contains an insulating synthetic resin, and circuit patterns 27A and 27B that are routed in the sheet member 22.

Sheet Member 22

Figure 3:
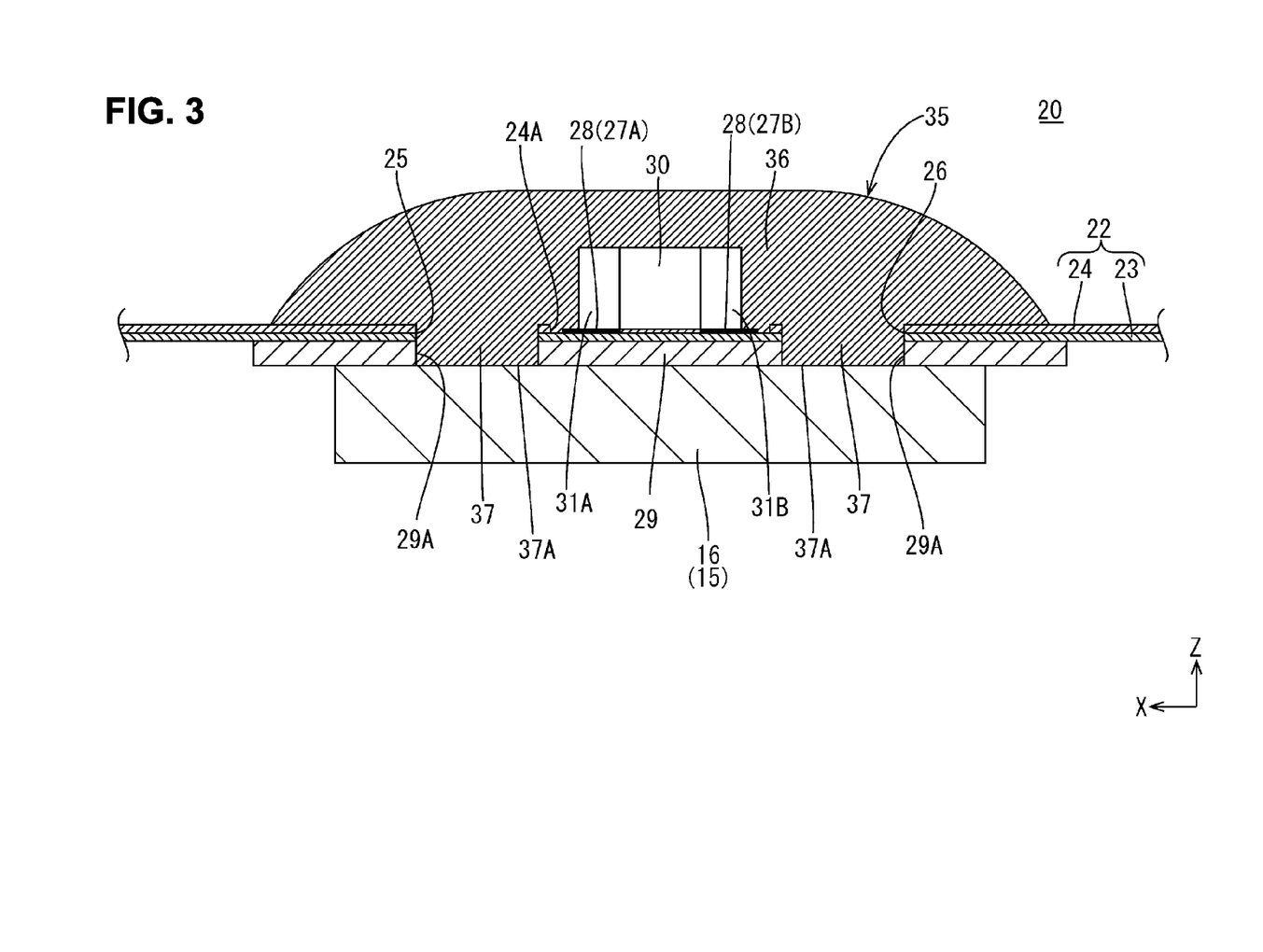
FIG. 3 is a cross-sectional view taken along a line A-A in FIG. 1.

The sheet member 22 is flexible and deformable, and as shown in FIG. 3, is made of an insulating synthetic resin and includes a base film 23 arranged under the circuit patterns 27A and 27B, and an insulating layer 24 that is made of an insulating overlay film, a coating film, or the like and covers the upper surfaces of the circuit patterns 27A and 27B. The insulating layer 24 is not formed on a rectangular region of the base film 23 that is overlapped with the temperature sensor 30, and is provided with an opening 24A that exposes the base film 23 and lands 28 of the circuit patterns 27A and 27B.

The sheet member 22 is provided with through holes 25 and 26 that pass through the base film 23 and the insulating layer 24. The through holes 25 and 26 are both rectangular (band-shaped) and extend in the left-right direction, and are arranged on opposite sides of the temperature sensor 30 (and the lands 28 of the circuit patterns 27A and 27B) in the sheet member 22. The base film 23 of the sheet member 22 and the insulating layer 24 can be formed from any synthetic resin selected as necessary, such as a thermosetting resin, a thermoplastic resin, or a liquid crystal polymer (LCP). The thermosetting resin can be any thermosetting resin selected as necessary, such as an epoxy resin. It is preferable to use a thermosetting resin due to having excellent heat resistance (heat resistance capable of withstanding melting during soldering) and dimensional stability. The thermoplastic resin can be any thermoplastic resin selected as necessary, examples of which include polypropylene (PP), polyethylene (PE), polyphenylene sulfide (PPS), polyethylene terephthalate (PET), polybutylene terephthalate (PBT), and polyimide (PI). Using a thermoplastic resin makes it possible to reduce the molding cost, and thus is preferable.

A reinforcing plate 29 is provided under the base film 23. The reinforcing plate 29 is made of a flat plate-like member made of a metal such as aluminum or an aluminum alloy, or a synthetic resin, and is fixed to the lower surface of the base film 23 using an adhesive or the like. A pair of reinforcing plate through holes 29A pass through the reinforcing plate 29 at positions corresponding to the lower sides of the through holes 25 and 26. The pair of reinforcing plate through holes 29A have the same shape as the through holes 25 and 26.

Circuit Patterns 27A and 27B

The circuit patterns 27A and 27B are made of metal foils (conductive paths) made of a metal such as copper, a copper alloy, aluminum, or an aluminum alloy, and are formed by known printed wiring technology that employs printing, etching, plating, or the like, and lands 28 having an increased width are respectively formed at end portions of the circuit patterns 27A and 27B. Terminals 31A and 31B of a thermistor serving as the temperature sensor 30 are soldered to the lands 28. As shown in FIG. 2, the circuit patterns 27A and 27B are respectively a first circuit pattern 27A that is routed along an L-shaped bent path, and a second circuit pattern 27B that is routed along an L-shaped bent path that extends along the first circuit pattern 27A. As shown in FIG. 2, the first circuit pattern 27A and the second circuit pattern 27B both extend side by side on one side in the left-right direction.

Temperature Sensor 30

The temperature sensor 30 is a chip-type NTC thermistor, for example. An NTC thermistor is a thermistor whose resistance decreases as the temperature rises, and includes a pair of terminals 31A and 31B that are provided at respective lengthwise end portions of a rectangular parallelepiped thermistor base that has internal electrodes, and are covered by metal plating made of Pb or the like. The arrangement direction in which the pair of terminals 31A and 31B of the temperature sensor 30 are arranged side by side (i.e., the front-rear direction) is orthogonal to the lengthwise direction of the through holes 25 and 26 of the FPC 21 (i.e., the left-right direction).

Heat Transfer Member 35

As shown in FIG. 3, the heat transfer member 35 is arranged on and bulges upward from the upper surface of the FPC 21, and includes a heat transfer body 36 in which the temperature sensor 30 is embedded, and a pair of heat receiving portions 37 that are arranged in the pair of through holes 25 and 26 and the pair of reinforcing plate through holes 29A and receive heat from the bus bar 15.

The heat transfer body 36 is in close contact with almost the entirety of the outer surface of the temperature sensor 30, and is arranged in a circular region that includes the opening 24A at the upper surface of the FPC 21 and the pair of through holes 25 and 26 (and the reinforcing plate through holes 29A). The temperature sensor 30 is entirely embedded inside the heat transfer body 36. The heat receiving portion 37 is provided so as to fill the space in the pair of through holes 25 and 26 of the bus bar 15 and the reinforcing plate through holes 29A of the reinforcing plate 29, and a lower end 37A of the heat receiving portion 37 is formed at a position conforming to the lower surface of the reinforcing plate 29.

The heat transfer member 35 can be constituted by a thermal paste, a gel, an adhesive, a synthetic resin, or the like. The thermal paste can be a material that has high thermal conductivity and insulating properties, such as silicone grease. The heat transfer member 35 may have viscosity, or may be a solidified member that does not have viscosity. It is possible to use a room temperature curing type of heat transfer member that cures at room temperature after assembly, or a heat curing type of heat transfer member that cures by being heated after assembly.

The assembly of the temperature measurement module 20 will be described below

The pair of terminals 31A and 31B of the temperature sensors 30 are mounted, by reflow soldering or the like, on the pairs of lands 28 exposed through the openings 24A of the insulating layer 24 of the FPC 21. Next, the material for forming the heat transfer member 35 is applied in a melted state onto each temperature sensor 30 (and the FPC 21). The portions of the heat transfer member 35 that fill the pair of through holes 25 and 26 are allowed to cure, and the heat transfer members 35 that cover the temperature sensors 30 on the FPC 21 are allowed to cure. As a result, the temperature measurement module 20 is formed.

Next, the bus bars 15 are connected to adjacent pairs of electrode terminals 12A and 12B of the power storage elements 11 by welding or the like. Next, when the temperature measurement module 20 is mounted on the power storage elements 11 and the bus bars 15, the reinforcing plates 29 of the FPC 21 are overlaid on the measurement target portions 16 of the bus bars 15. Also, a voltage detection circuit pattern of the FPC 21 is connected to the bus bars 15 by voltage detection terminals 33 (FIG. 1). As a result, the power storage module 10 is formed.

According to the present embodiment, actions and effects such as the following are exhibited.

A temperature measurement module 20 is for measuring the temperature of a bus bar 15 (temperature measurement target) and includes: an FPC 21 (flexible printed circuit board) that includes an insulating sheet member 22 and circuit patterns 27A and 27B routed in the sheet member 22; a temperature sensor 30 attached to the FPC 21; and a heat transfer member 35 thermally fixed to the temperature sensor 30, wherein the sheet member 22 is provided with through holes 25 and 26 located outward of a region overlapped with the temperature sensor 30, and the heat transfer member 35 includes heat receiving portions 37 that are arranged inside the through holes 25 and 26 and receive heat from the bus bar 15.

According to the present embodiment, heat from the bus bar 15 is transferred to the heat receiving portions 37 of the heat transfer member 35 in the through holes 25 and 26 of the FPC 21, and the heat is transferred to the temperature sensor 30 via the heat transfer member 35. As a result, heat is easily transferred from the bus bar 15 to the temperature sensor 30, thus making it possible to suppress a decrease in the accuracy of temperature measurement performed by the temperature sensor 30.

Also, the through holes 25 and 26 are arranged on opposite sides of the temperature sensor 30 in the sheet member 22.

According to this configuration, heat from the bus bar 15 can be transferred to the temperature sensor 30 via the through holes 25 and 26 on opposite sides of the temperature sensor 30, and therefore heat can be more easily transferred from the bus bar 15 to the temperature sensor 30, and it is possible to improve the accuracy of temperature measurement.

Also, the heat transfer member 35 fills the through holes 25 and 26.

According to this configuration, the thermal conductivity in the through holes 25 and 26 can be improved.

Also, the temperature sensor 30 includes the terminals 31A and 31B, and the circuit patterns 27A and 27B extend along a direction that is orthogonal to the arrangement direction of the terminals 31A and 31B.

According to this configuration, the circuit patterns 27A and 27B can be routed efficiently, and thus the wiring density of the FPC 21 can be increased.

Also, a reinforcing plate 29 is overlaid on the bus bar 15 side of the FPC 21, the reinforcing plate 29 includes reinforcing plate through holes 29A that are in communication with the through holes 25 and 26, and the heat transfer member 35 is provided in the reinforcing plate through holes 29A.

According to this configuration, bending of the FPC 21 can be suppressed by the reinforcing plate 29. Also, heat from the bus bar 15 can be transferred to the temperature sensor 30 via the heat transfer member 35 in the reinforcing plate through holes 29A.

Also, a power storage module 10 includes a plurality of power storage elements 11 that each include positive and negative electrode terminals 12A and 12B, bus bars 15 that connect adjacent pairs of the electrode terminals 12A and 12B of the power storage elements 11 and serve as a temperature measurement target, and the temperature measurement module 20.

According to this configuration, it is possible to measure the temperature of the bus bars 15 that connect the electrode terminals 12A and 12B of the power storage elements 11.

Second Embodiment

Figure 4:
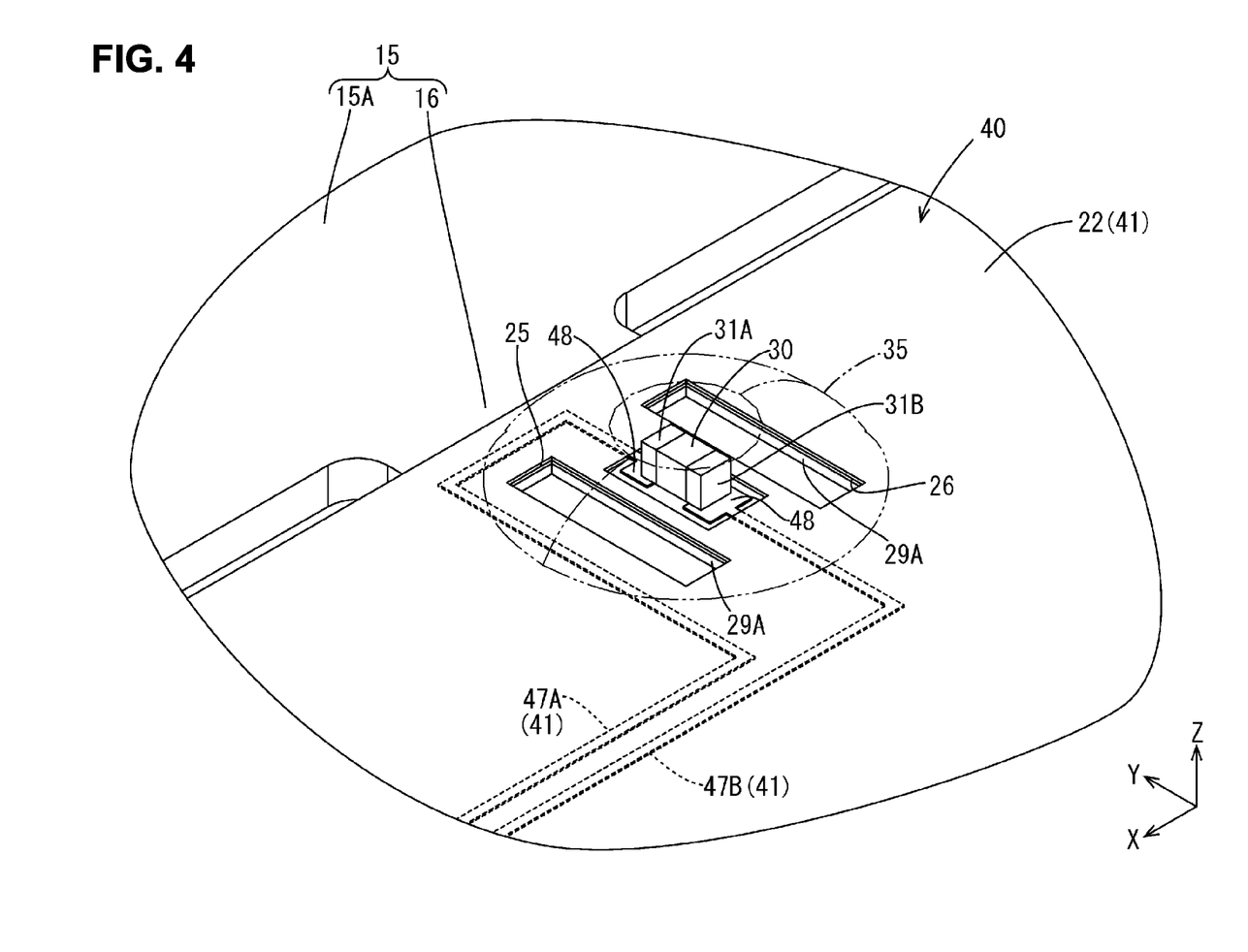
FIG. 4 is an enlarged perspective view of a region including a temperature sensor and a heat transfer member in a power storage module according to a second embodiment.

Next, a second embodiment will be described with reference to FIG. 4. In a temperature measurement module 40 of the second embodiment, the orientation of the temperature sensor 30 and the paths of circuit patterns 47A and 47B are different from those in the first embodiment. Other aspects of the configuration are the same as in the first embodiment, and therefore components the same as those in the first embodiment are designated by the same reference numerals and will not be described below.

The temperature measurement module 40 includes an FPC 41, the temperature sensor 30, and the heat transfer member 35. The FPC 41 includes the first circuit pattern 47A and the second circuit pattern 47B that are routed in the sheet member 22. The first circuit pattern 47A and the second circuit pattern 47B extend in opposite directions in the left-right direction relative to the pair of left and right lands 48, and then bend and extend side by side toward one end side of the FPC 41. The arrangement direction of the pair of terminals 31A and 31B of the temperature sensor 30 is a direction conforming to the lengthwise direction of the through holes 25 and 26 of the FPC 41 (the direction extending along a long side).

According to the second embodiment, the temperature measurement module 40 includes the first circuit pattern 47A and the second circuit pattern 47B that extends in a direction opposite to the first circuit pattern 47A relative to the temperature sensor 30.

According to this configuration, the circuit patterns 47A and 47B can be routed efficiently, and thus the wiring density of the FPC 41 can be increased.

Third Embodiment

Figure 5:
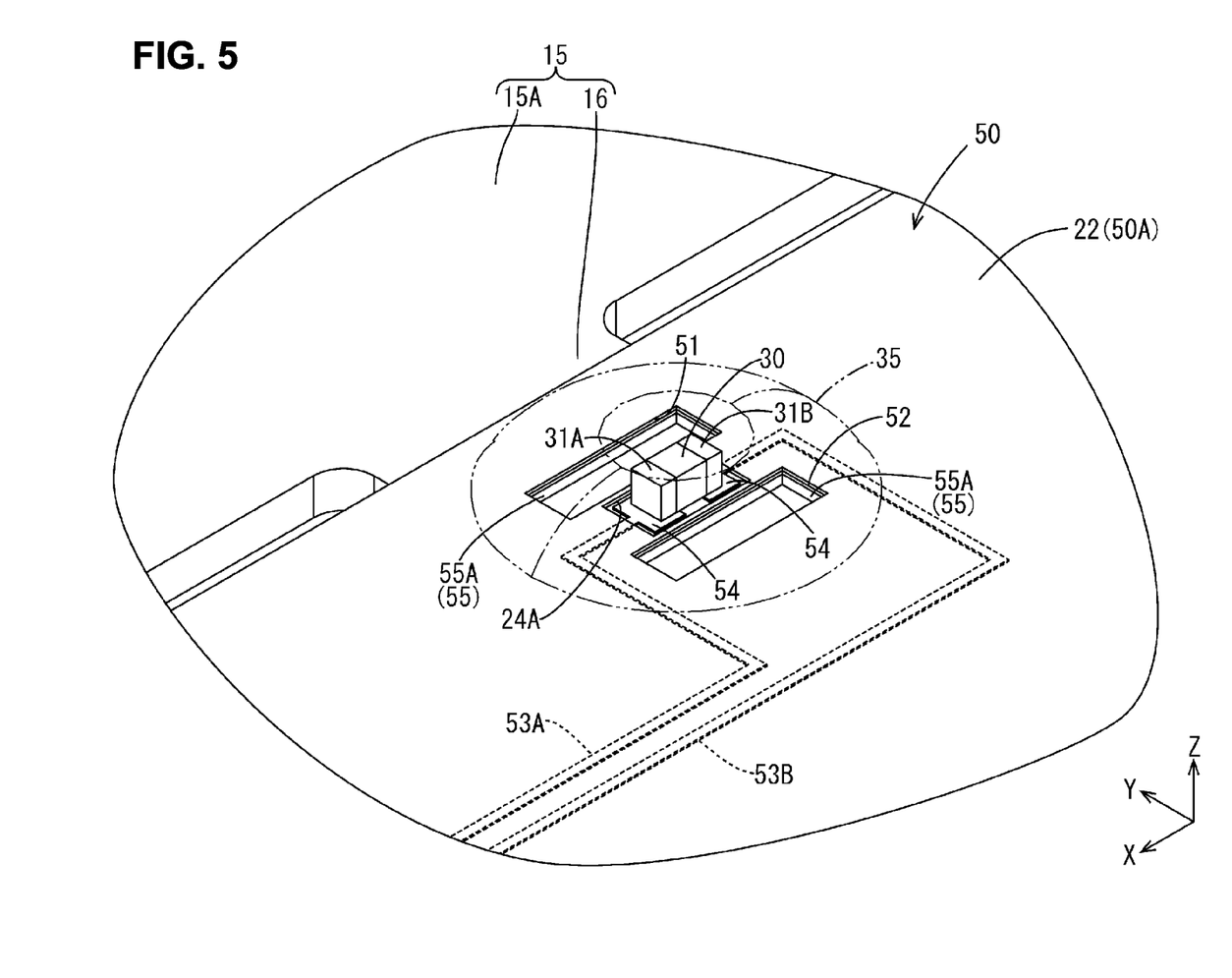
FIG. 5 is an enlarged perspective view of a region including a temperature sensor and a heat transfer member in a power storage module according to a third embodiment.

Next, a third embodiment will be described with reference to FIG. 5. In a temperature measurement module 50 of the third embodiment, the arrangement direction of the terminals 31A and 31B of the temperature sensor 30 and the lengthwise direction (long side direction) of through holes 51 and 52 are set to the front-rear direction (extending direction of an FPC 50A). Other aspects of the configuration are the same as in the above embodiments, and therefore components the same as those in the above embodiments are designated by the same reference numerals and will not be described below.

The through holes 51 and 52 that pass through the sheet member 22 of the FPC 50A have a rectangular shape and extend in the front-rear direction. A pair of reinforcing plate through holes 55A pass through a reinforcing plate 55 at positions corresponding to the lower sides of the through holes 51 and 52. The pair of reinforcing plate through holes 55A have the same shape as the through holes 51 and 52. The FPC 50A includes circuit patterns 53A and 53B that are routed in the sheet member 22. The first circuit pattern 53A and the second circuit pattern 53B are provided with a pair of front and rear lands 54 in the opening 24A that has a rectangular shape, extends in the front-rear direction, and passes through the insulating layer 24. The first circuit pattern 53A and the second circuit pattern 53B extend in opposite directions in the front-rear direction from the pair of front and rear lands 54, and then bend and extend side by side toward one end side of the FPC 50A. The arrangement direction of the pair of terminals 31A and 31B of the temperature sensor 30 extends along the lengthwise direction (long side direction) of the through holes 51 and 52 of the FPC 50A and the extending direction of the FPC 50A.

Fourth Embodiment

Figure 6:
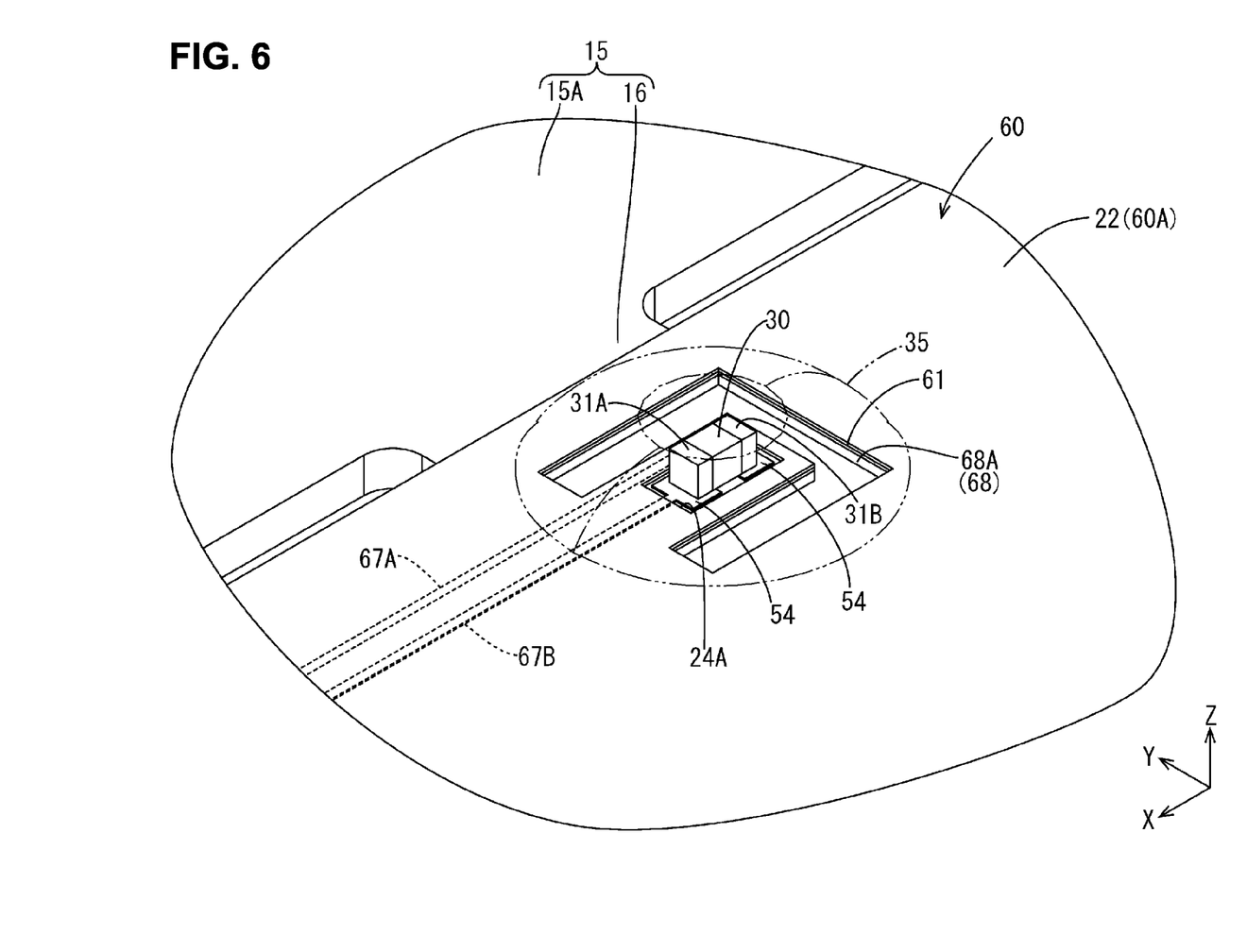
FIG. 6 is an enlarged perspective view of a region including a temperature sensor and a heat transfer member in a power storage module according to a fourth embodiment.

Next, a fourth embodiment will be described with reference to FIG. 6. A temperature measurement module 60 of the fourth embodiment has a U-shaped through hole 61. Other aspects of the configuration are the same as in the above embodiments, and therefore components the same as those in the above embodiments are designated by the same reference numerals and will not be described below.

An FPC 60A of the temperature measurement module 60 includes a first circuit pattern 67A and a second circuit pattern 67B that are routed in the sheet member 22. The first circuit pattern 67A and the second circuit pattern 67B are provided with a pair of front and rear lands 54 in the opening 24A that passes through the insulating layer 24. The sheet member 22 of the FPC 60A is provided with the U-shaped through hole 61 that is open on the front side (one side in the front-rear direction). Due to the provision of the through hole 61, the pair of circuit patterns 67A and 67B, which are connected to the pair of front and rear lands 54, extend side by side toward the front side (the open side of the through hole 61). A reinforcing plate through hole 68A passes through a reinforcing plate 68 at positions corresponding to the lower side of the through hole 61. The reinforcing plate through hole 68A has the same shape as the through hole 61.

Fifth Embodiment

Figure 7:
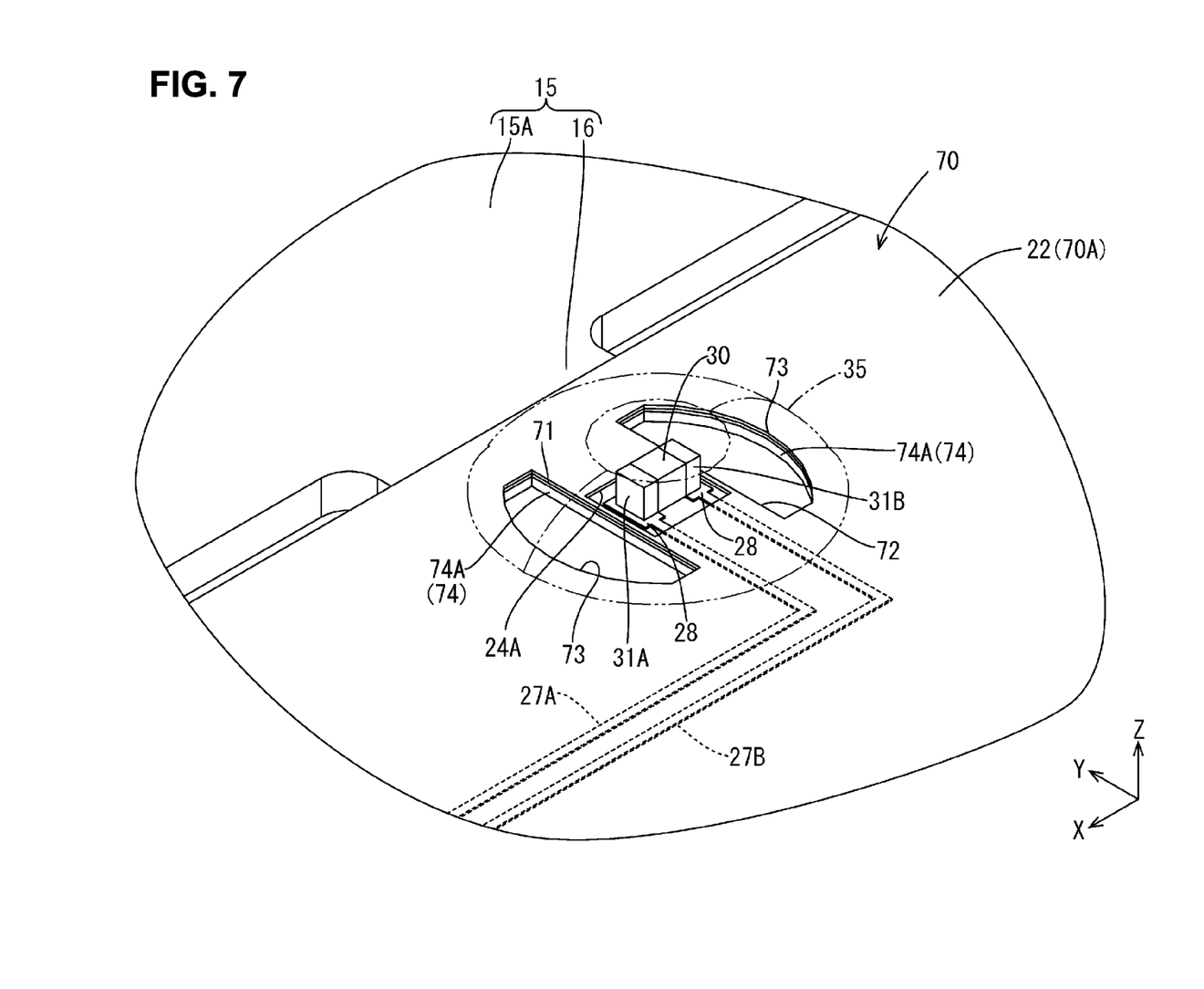
FIG. 7 is an enlarged perspective view of a region including a temperature sensor and a heat transfer member in a power storage module according to a fifth embodiment.

Next, a fifth embodiment will be described with reference to FIG. 7. In a temperature measurement module 70 of the fifth embodiment, through holes 71 and 72 have different shapes from the first embodiment. Other aspects of the configuration are the same as in the above embodiments, and therefore components the same as those in the above embodiments are designated by the same reference numerals and will not be described below.

An FPC 70A of the temperature measurement module 70 is provided with the through holes 71 and 72 that pass through the sheet member 22. The through holes 71 and 72 have a substantially rectangular shape, and a bulging portion 73 that bulges in an arc shape is formed at the edge portion on the side distant from the temperature sensor 30. The bulging portion 73 is curved along the shape (outer peripheral shape) of the edge portion of the heat transfer member 35. A pair of reinforcing plate through holes 74A pass through a reinforcing plate 74 at positions corresponding to the lower sides of the through holes 71 and 72. The pair of reinforcing plate through holes 74A have the same shape as the through holes 71 and 72.

According to the fifth embodiment, the areas of the through holes 71 and 72 can be increased without increasing the outer diameter of the heat transfer member 35, thus making it possible to improve the ability for heat to be transferred by the heat transfer member 35 in the through holes 71 and 72.

OTHER EMBODIMENTS

The technology described in the present specification is not limited to the embodiments described above and in the drawings, and for example, embodiments such as the following are also included in the technical scope of the technology described herein.

(1) In the above embodiments, the material forming the heat transfer member 35 is applied to the FPC 21 (41,50A, 60A, 70A) and the temperature sensor 30, and then the temperature measurement module is attached to the top of the bus bars 15 and the power storage elements 11, but the present invention is not limited to this, and the material forming the heat transfer member 35 may be applied to the FPC 21 (41,50A, 60A, 70A) and the temperature sensor 30 after the temperature measurement module is attached to the top of the bus bars 15 and the power storage elements 11.

(2) Although the temperature sensor 30 is described as being an NTC thermistor, it may be another type of thermistor such as a PTC thermistor, or a thermocouple other than a thermistor, for example.

LIST OF REFERENCE NUMERALS

10 Power storage module
11 Power storage element
12A, 12B Electrode terminal
15 Bus bar
15A Bus bar body
16 Measurement target portion
20, 40, 50, 60, 70 Temperature measurement module
21, 41, 50A, 60A, 70A FPC (Flexible Printed Circuit Board)
22 Sheet member
23 Base film
24 Insulating layer
24A Opening
25, 26, 51, 52, 61, 71, 72 Through hole
27A, 47A, 53A, 67A First circuit pattern
27B, 47B, 53B, 67B Second circuit pattern
28, 48, 54 Land
29, 55, 68, 74 Reinforcing plate
29A, 55A, 68A, 74A Reinforcing plate through hole
30 Temperature sensor
31A, 31B Terminal
33 Voltage detection terminal
35 Heat transfer member
36 Heat transfer body
37 Heat receiving portion
37A Lower end
73 Bulging portion

The invention claimed is:

1. A temperature measurement module for measuring the temperature of a temperature measurement target, the temperature measurement module comprising:
a flexible printed circuit board that includes an insulating sheet member and a circuit pattern routed in the sheet member;
a temperature sensor attached to the flexible printed circuit board; and
a heat transfer member thermally fixed to the temperature sensor,
wherein the sheet member includes a through hole located outward of a region overlapped with the temperature sensor,
the heat transfer member includes a heat receiving portion that is arranged in the sheet member through hole and is configured to receive heat from the temperature measurement target,
the temperature measurement module further comprises:
a reinforcing plate arranged on a temperature measurement target side of the flexible printed circuit board,
the reinforcing plate includes a reinforcing plate through hole that is in communication with the sheet member through hole, and the heat receiving portion is arranged inside the reinforcing plate through hole, and
the heat receiving portion is provided so as to fill the space in the sheet member through hole and the reinforcing plate through hole, and a lower end of the heat receiving portion is formed at a position conforming to a lower surface of the reinforcing plate.

2. The temperature measurement module according to claim 1,
wherein a plurality of the sheet member through holes are provided respectively on opposite sides of the temperature sensor in the sheet member.

3. The temperature measurement module according to claim 1,
wherein the heat transfer member fills the sheet member through hole.

4. The temperature measurement module according to claim 1,
wherein the temperature sensor includes a plurality of terminals, and
the flexible printed circuit board includes a plurality of the circuit patterns that are connected to the terminals, and the plurality of circuit patterns include a first circuit pattern and a second circuit pattern that extends in a direction opposite to the first circuit pattern relative to the temperature sensor.

5. The temperature measurement module according to claim 1,
wherein the temperature sensor includes a plurality of terminals, and
the circuit pattern extends along a direction orthogonal to a direction in which the plurality of terminals are arranged side by side.

6. A power storage module comprising:
a plurality of power storage elements that each include a positive electrode terminal and a negative electrode terminal;
bus bars that serve as a temperature measurement target and each connect adjacent electrode terminals of the power storage elements; and
the temperature measurement module according to claim 1.

* * * * *